United States Patent
Kushima

(10) Patent No.: US 8,298,864 B2
(45) Date of Patent: Oct. 30, 2012

(54) MANUFACTURING METHOD FOR SEMICONDUCTOR DEVICE

(75) Inventor: Yoshimasa Kushima, Yamanashi (JP)

(73) Assignee: Oki Semiconductor Co., Ltd., Tokyo (JP)

(*) Notice: Subject to any disclaimer, the term of this patent is extended or adjusted under 35 U.S.C. 154(b) by 303 days.

(21) Appl. No.: 12/636,924

(22) Filed: Dec. 14, 2009

(65) Prior Publication Data
US 2010/0151628 A1 Jun. 17, 2010

(30) Foreign Application Priority Data
Dec. 17, 2008 (JP) ................... 2008-321041

(51) Int. Cl.
*H01L 21/00* (2006.01)
(52) U.S. Cl. .......................... 438/114; 438/465
(58) Field of Classification Search .......... 438/106–127, 438/460–465
See application file for complete search history.

(56) References Cited

U.S. PATENT DOCUMENTS
2001/0003049 A1* 6/2001 Fukasawa et al. ............ 438/127
2001/0018229 A1* 8/2001 Kato et al. .................... 438/106
2003/0194835 A1* 10/2003 Kim et al. ..................... 438/113
2008/0182387 A1* 7/2008 Feng et al. .................... 438/465
2009/0311829 A1* 12/2009 Yang et al. .................... 438/109

FOREIGN PATENT DOCUMENTS
JP 2005-019435 1/2005
* cited by examiner

*Primary Examiner* — Fernando L Toledo
*Assistant Examiner* — Karen Kusumakar
(74) *Attorney, Agent, or Firm* — Volentine & Whitt, PLLC

(57) ABSTRACT

An improved manufacturing method for semiconductor devices is provided. This method can prevent chips and cracks from being generated when the rear face of the semiconductor substrate is polished. The manufacturing method includes preparing a semiconductor substrate having a front face and a rear face. The front face has an inner surface area and a peripheral surface area. Circuit elements are provided in the inner surface area of the semiconductor substrate. The manufacturing method also includes sealing the circuit elements with circuit sealing resin. The manufacturing method also includes providing cured resin in the peripheral surface area of the semiconductor substrate. The manufacturing method also includes polishing the rear face of the semiconductor substrate after the circuit sealing step. The manufacturing method also includes cutting the semiconductor substrate after the substrate polishing step so as to obtain semiconductor devices.

20 Claims, 8 Drawing Sheets

MANUFACTURING METHOD FOR SEMICONDUCTOR DEVICE

BACKGROUND OF THE INVENTION

1. Field of the Invention

The present invention relates to a manufacturing method for a semiconductor device having circuit elements that are resin-sealed on a surface of a semiconductor substrate.

2. Description of the Related Art

In a conventional way of resin-sealing semiconductor elements formed on the front surface of a semiconductor substrate (e.g., silicon substrate) for a purpose of protection, the peripheral portion of the semiconductor substrate is secured with a special die, for example, and the semiconductor substrate is then covered with resin. Because of this, resin is provided only in the inner area on the surface where the semiconductor elements are formed, and resin is not provided on the peripheral area of the semiconductor substrate. Consequently, a step difference for the thickness of the resin is generated between the inner area and the peripheral area on the substrate surface. Normally the thickness of the substrate is adjusted by polishing the rear face of the semiconductor substrate after resin-sealing. Impact due to grinding or the like makes the semiconductor substrate unstable due to the step difference formed in the substrate peripheral portion, and this creates chips and cracks in the semiconductor substrate. In order to solve this problem, Japanese Patent Application Kokai (Laid-Open) No. 2005-19435, for example, discloses a wafer polishing method for removing the peripheral portion of the semiconductor substrate by cutting or polishing before polishing the rear face of the semiconductor substrate.

If the peripheral portion of the semiconductor substrate is removed, as disclosed in Japanese Patent Application Kokai No. 2005-19435, the resin existing in the boundary between the inner area and the peripheral portion on the surface is peeled or removed upon cutting or polishing. As a result, the instability that is generated during polishing the rear face of the semiconductor substrate cannot be prevented, and chips and cracks are generated in the semiconductor substrate. Load is also applied to the semiconductor substrate itself by cutting or polishing when the peripheral portion is removed, and chips and cracks are generated in the semiconductor substrate due to this vibration and shock.

SUMMARY OF THE INVENTION

It is an object of the present invention to provide an improved manufacturing method for a semiconductor device with which chips and cracks are not generated when the rear face of the semiconductor substrate is polished.

According to one aspect of the present invention, there is provided a manufacturing method for a semiconductor device that includes a substrate preparation step of preparing a semiconductor substrate. The semiconductor substrate has a front face and a rear face. The front face has an inner surface area and a peripheral surface area. Circuit elements are formed in the inner surface area. The manufacturing method also includes a circuit sealing step of sealing the circuit elements with circuit sealing resin. The manufacturing method also includes a substrate polishing step of polishing the rear face of the semiconductor substrate after the circuit sealing step. The manufacturing method also includes a substrate cutting step of cutting the semiconductor substrate after the substrate polishing step so as to obtain a semiconductor device (or devices). The manufacturing method also includes a peripheral area resin formation step of providing cured resin in the peripheral surface area of the semiconductor substrate. The peripheral area resin formation step is carried out after the circuit sealing step and before the substrate polishing step.

This manufacturing method can provide semiconductor devices with which chips and cracks are not generated when the rear faces of the semiconductor substrates are polished.

The peripheral area resin formation step may include enclosing a periphery of the semiconductor substrate after the circuit sealing step. The peripheral area resin formation step may also include injecting liquid resin into the peripheral surface area. The peripheral area resin formation step may also form the cured resin by curing the injected liquid resin.

The resin injection step may include covering the surface of the circuit sealing resin with a resin injection mask having a plurality of openings, and injecting the liquid resin via the plurality of openings.

The resin injection step may include injecting the liquid resin into a plurality of locations in the peripheral surface area in a predetermined order or simultaneously.

The substrate polishing step may polish the rear face of the semiconductor substrate after attaching a protective tape on the surfaces of the circuit sealing resin and the cured resin.

The circuit sealing resin and the cured resin may be the same or similar type of resin.

The circuit sealing step may provide the circuit sealing resin in the inner surface area only.

The substrate enclosing step may be carried out with a periphery enclosing member. The semiconductor substrate, the circuit sealing resin and the periphery enclosing member may define in combination a recess or cavity to receive the liquid resin injected in the resin injection step.

The height of the circuit sealing resin may be the same as the height of the cured resin.

These and other objects, aspects and advantages of the present invention will become more apparent to those skilled in the art from the following detailed description when read and understood in conjunction with the appended claims and drawings.

DETAILED DESCRIPTION OF THE INVENTION

Embodiments of the present invention will now be described with reference to the accompanying drawings.

First Embodiment

Referring to FIG. 1A to FIG. 1G together with FIG. 2, a manufacturing method for a semiconductor device according to the first embodiment will be described.

Figure 1A:
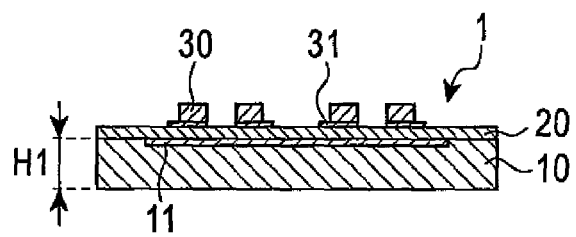
FIG. 1A to FIG. 1G are a series of cross-sectional views depicting respective steps of the manufacturing method for a semiconductor device according to a first embodiment of the present invention.
Figure 2:
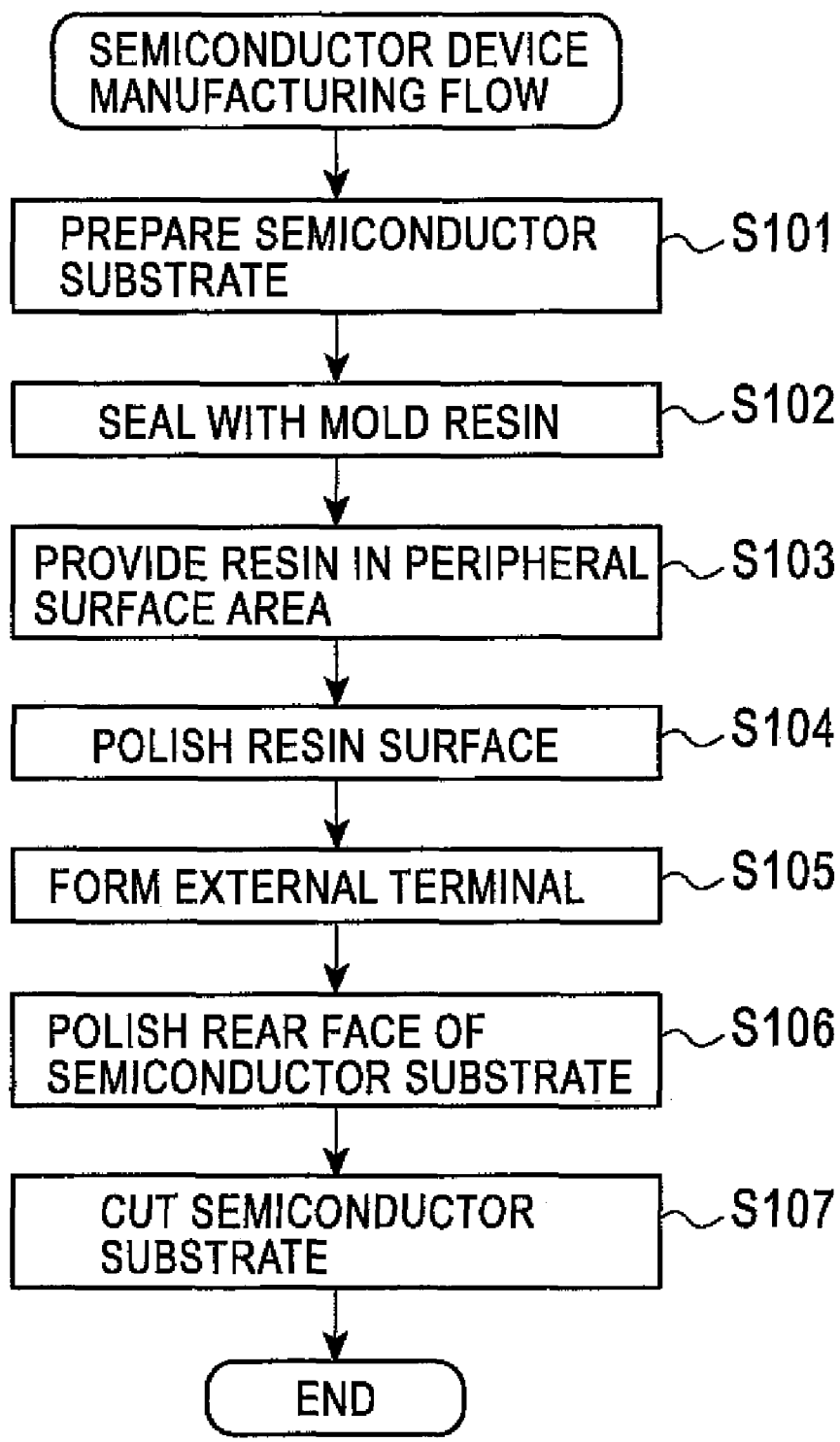
FIG. 2 is a flow chart depicting the semiconductor device manufacturing flow according to the first embodiment.
Figure 3:
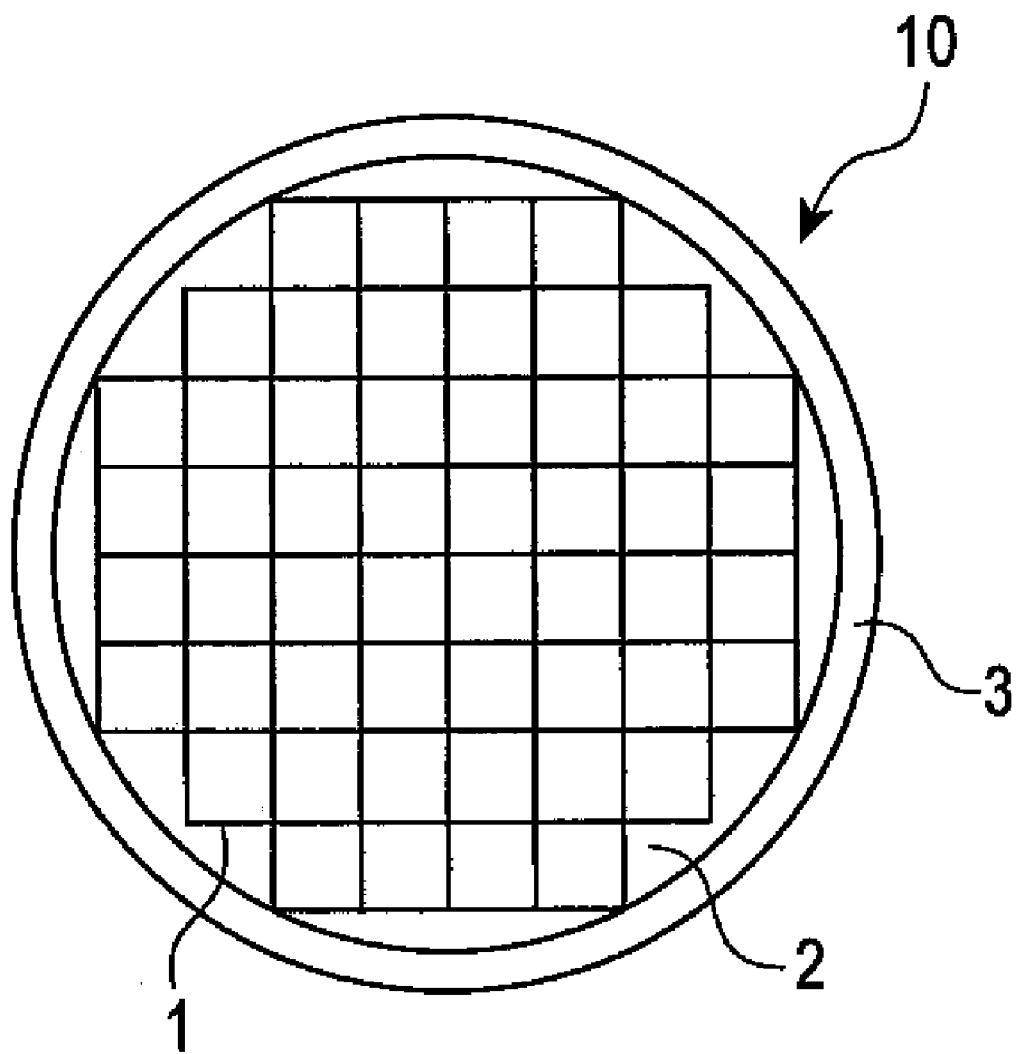
FIG. 3 is a top view of a semiconductor substrate on which semiconductor circuits are formed.

First a semiconductor substrate 10 made from silicon mono-crystals, for example, is prepared (step S101, FIG. 1A). Circuit elements 1 are formed on the semiconductor substrate 10. The circuit element 1 includes a semiconductor element 11, insulation film 20, conductive posts 30 and conductive interconnect 31. The thickness H1 of the semiconductor substrate 10 is about 700 µm. On the surface of the semiconductor substrate 10, there is provided the semiconductor element 11, such as a transistor. The insulation film 20 is made from silicon dioxide film $SiO_2$, for example, and is formed on the semiconductor element 11. The conductive post 30 is made from copper, for example, and is formed on the insulation film 20. The conductive posts 30 are electrically connected to the semiconductor element 11 via the conductive interconnect 31. The conductive interconnector 31 may also be made from copper. FIG. 3 is a top view of the semiconductor substrate 10 on which a plurality of circuit elements 1 are formed. Hereafter, an area where the circuit elements 1 are formed is referred to as an inner surface area 2, and a peripheral portion outside the inner surface area 2 is referred to as a peripheral surface area 3.

Figure 1B:
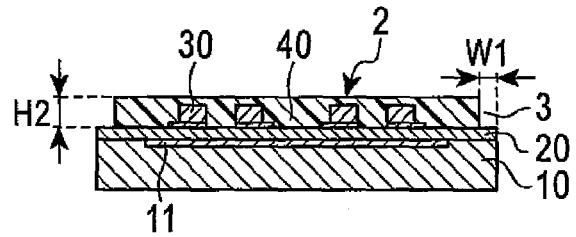

After the step S101 (FIG. 1A), the circuit element 1 is sealed with epoxy resin 40 for circuit protection (step S102, FIG. 1B). The resin 40 is hereafter referred to as "circuit sealing resin 40." The circuit sealing resin 40 is coated (applied) on the surface of the semiconductor substrate 10 while the peripheral surface area 3 of the semiconductor substrate 10 is secured by a die (not shown). As a result, the circuit sealing resin 40 is formed only on the inner surface area 2 of the semiconductor substrate 10, and a step difference with the thickness H2 is generated in the boundary between the inner surface area 2 and the peripheral surface area 3. The thickness H2 is the thickness of the circuit sealing resin 40. In the illustrated embodiment, the thickness H2 is about 200 µm, for example, which is sufficient to cover (bury) the entire conductive posts 30. The width W1 of the peripheral surface area 3 in the radius direction is about 2.4 mm, for example.

Figure 1C:
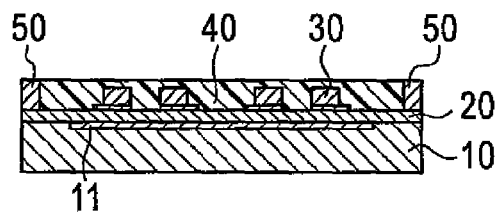
Figure 1D:
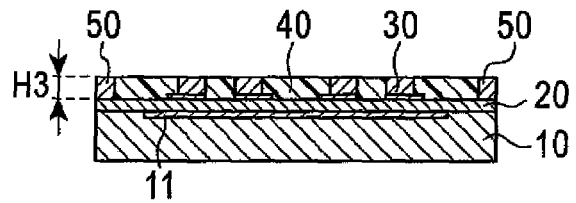

Then the cured resin 50 is provided in the peripheral surface area 3 (step S103, FIG. 1C). FIG. 4A to FIG. 4D show a series of cross-sectional views depicting respective steps of the peripheral surface area resin formation processing. FIG. 5 is a flow chart depicting the peripheral surface area resin formation processing. The peripheral surface area resin formation processing will now be described with reference to FIGS. 4A-4D and FIG. 5.

Figure 4A:
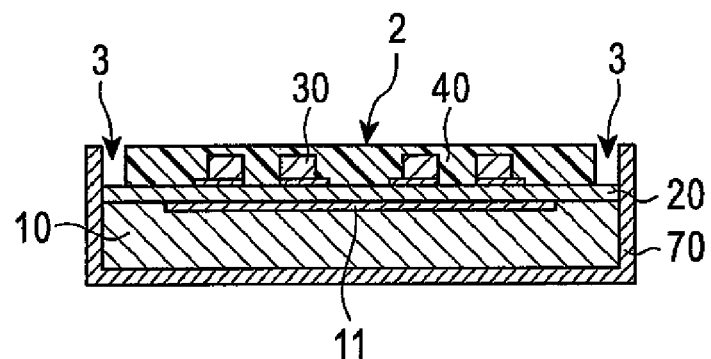
FIG. 4A to FIG. 4D are a series of cross-sectional views depicting respective steps of peripheral area resin formation processing according to the first embodiment.
Figure 4B:
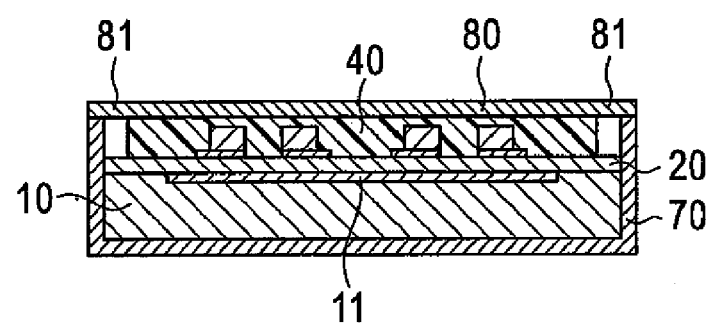
Figure 5:
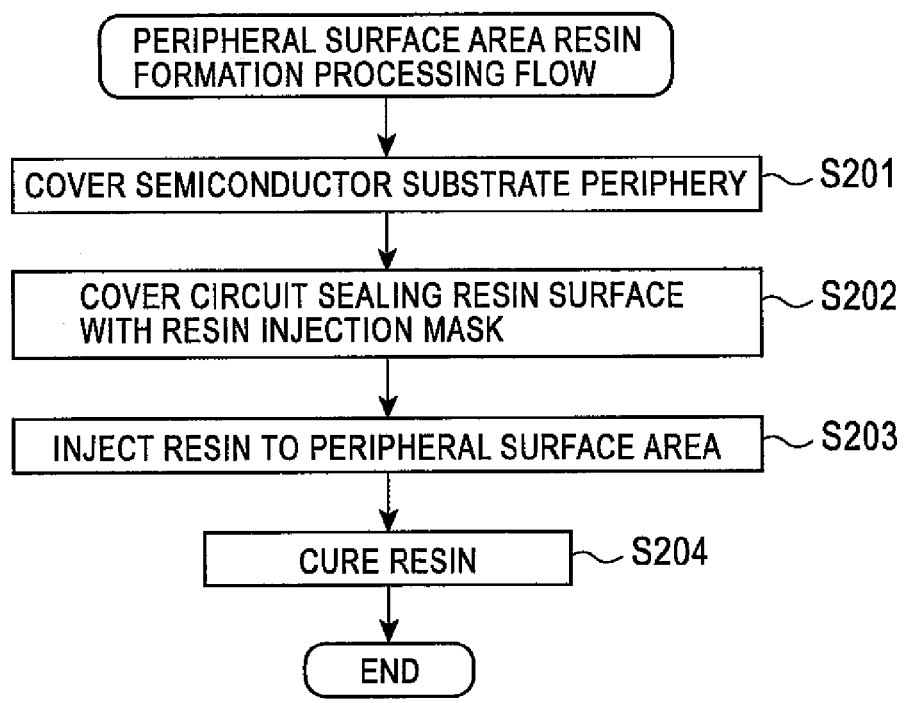
FIG. 5 is a flow chart depicting the peripheral area resin formation flow according to the first embodiment.
Figure 6A:
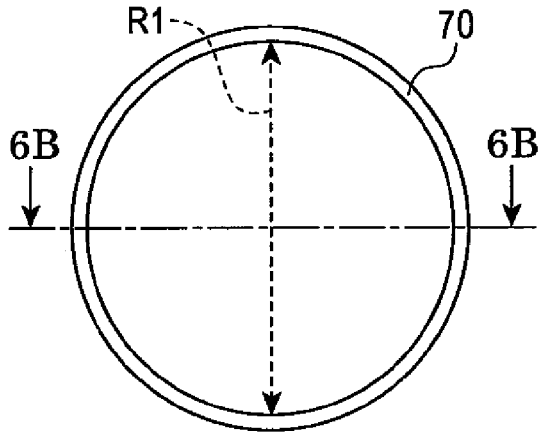
FIG. 6A illustrates a top view of the substrate periphery enclosure element.
Figure 6B:
FIG. 6B is a cross-sectional view taken along the 6B-6B line in FIG. 6A.

First the periphery of the semiconductor substrate 10, on which the circuit sealing resin 40 is provided, is enclosed by a substrate periphery enclosure element 70 (step S201, FIG. 4A). FIG. 6A is a top view of the substrate periphery enclosure element 70, and FIG. 6B is a cross-sectional view thereof along the dashed line 6B-6B. The periphery enclosure element 70 is made from such metal as stainless steel, and has a shallow cylindrical shape, for example, as shown in FIG. 6B. This shape is suitable for the shape of the semiconductor substrate 10 which has a circular shape (e.g., a circular silicon wafer), and the inner diameter R1 of the cylindrical member 70 is approximately the same as the diameter of the circular semiconductor substrate 10. The height H3 of the inner wall of the cylindrical member 70 is approximately 950 µm. This is the total of the thickness H1 (approximately 700 µm) of the semiconductor substrate 10, thickness H2 (approximately 200 µm) of the circuit sealing resin 40, and a thickness (approximately 50 µm) of the insulation film 20.

Figure 7:
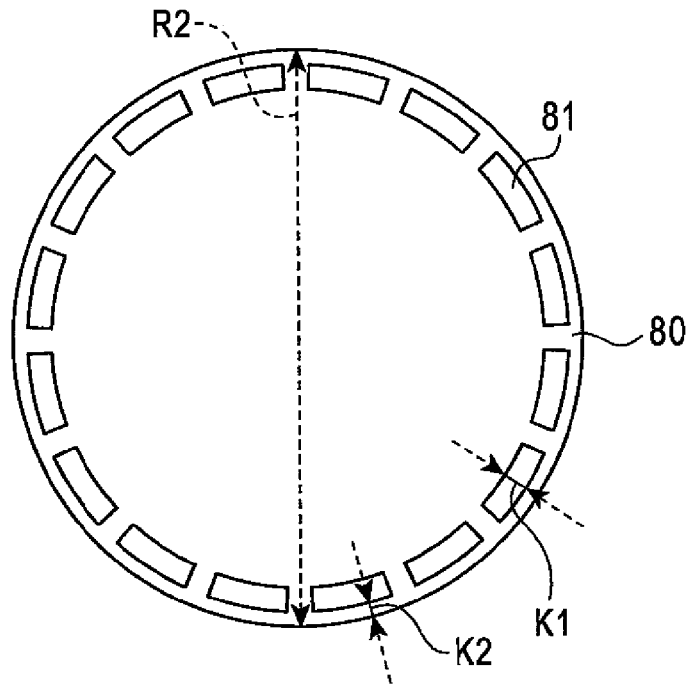
FIG. 7 is a top view of a mask for resin injection which has a plurality of openings.

As FIG. 4A shows, the semiconductor substrate 10, on which the circuit sealing resin 40 is provided, is housed (received) in the cylindrical member 70, so as to enclose the periphery of the semiconductor substrate 10 with the periphery enclosure member 70. The peripheral area of the semiconductor substrate 10 and the insulation film 20 formed on the semiconductor substrate 10 contact the inner wall of the periphery enclosure member 70. There is a gap between the periphery of the inner surface area 2 and the inner wall of the substrate enclosure element 70, that is the peripheral surface area 3. This gap defines an annular groove or recess that will receive liquid resin (will be described with reference to FIG. 4C). Then the surface of the circuit sealing resin 40 is covered by the resin injection mask 80 (step S202, FIG. 4B). FIG. 7 is a top view of the resin injection mask 80. The material of the resin injection mask 80 is metal, such as stainless steel, and the thickness thereof is 200 µm, for example. The resin injection mask 80 has a plurality of openings 81. The number of openings 81 is not limited to that illustrated, and FIG. 7 shows only an example. The shape of each opening 81 shown in FIG. 7 is a rectangle, but may be another shape, such as a circle. The openings 81 are formed in the peripheral area of the resin injection mask 80 such that the openings 81 are located along the peripheral surface area 3 of the semiconductor substrate 10 when the surface of the circuit sealing resin 40 is covered by the resin injection mask 80.

Figure 8:
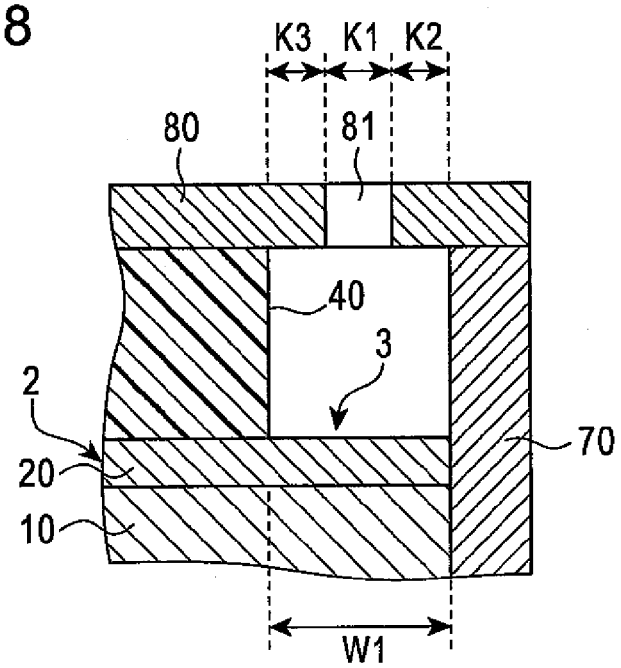
FIG. 8 is an enlarged cross-sectional view around one of the openings of the mask shown in FIG. 7 when a surface of the circuit sealing resin is covered with the mask of FIG. 7.

FIG. 8 is an enlarged cross-sectional view around one of the openings 81 when the surface of the circuit sealing resin 40 is covered by the resin injection mask 80. For example, the width W1 of the peripheral surface area 3 in the radius direction is 2.4 mm, the width K1 of the opening 81 in the radius direction is approximately 1 mm, the width K2 from the outer edge of the opening 81 to the outer edge of the peripheral surface area 3 is 0.7 mm, and the width K3 from the inner edge of the opening 81 to the outer edge of the inner surface area 2 is also 0.7 mm. The circuit sealing resin 40, is provided in the inner surface area 2, but the peripheral surface area 3 is hollow that defines the recess (or groove or cavity) to receive liquid resin.

Figure 4C:
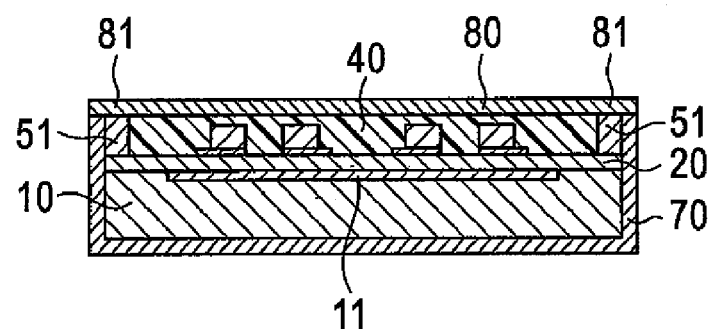

Then the liquid resin 51 is injected into the peripheral surface area (or the recess) 3 through the openings 81 of the resin injection mask 80 (step S203, FIG. 4C). In concrete terms, the liquid resin 51 is injected by normal printing technology with a common (or known) mask used in semiconductor wafer processing fields. In other words, while discharging the liquid resin 51 onto the resin injection mask 80, the liquid resin 51 is evenly injected only onto the peripheral surface area 3 using a squeegee.

In order to prevent resin from peeling in the step of polishing the circuit sealing resin 40, which is performed later, it is preferable that the liquid resin 51 is the same (or similar) type of resin as (or to) the circuit sealing resin 40. For example, if the circuit sealing resin 40 is epoxide resin, then epoxide resin having similar viscosity, after-curing-hardness, and type and ratio of included impurities (e.g., filler) is also used for the liquid resin 51. The liquid resin 51 may be bisphenol A type liquid epoxide resin, or liquid epoxide resin of which major component is modified polyamine. The viscosity of the liquid resin 51 is about 15000 to 30000 mPa·s. The liquid resin 51 injected through the openings 81 spreads and fills not only into the area directly under the openings 81, but also the entire cavity (or recess) of the peripheral surface area 3.

The injection amount of the liquid resin 51 is at least sufficient to fill the entire cavity of the peripheral surface area 3. This injection amount can be easily calculated based on such conditions as the diameter of the semiconductor substrate 10 (i.e., diameter of a wafer), the diameter of the inner surface area 2 (i.e., diameter of the circular area on which circuit sealing resin 40 is provided), and the thickness H2 of the circuit sealing resin 40.

By injecting the liquid resin 51 via the resin injection mask 80, the liquid resin 51 can be injected only into the peripheral surface area 3 without causing the liquid resin 51 to adhere to the circuit sealing resin 40 formed on the inner surface area 2.

Figure 4D:
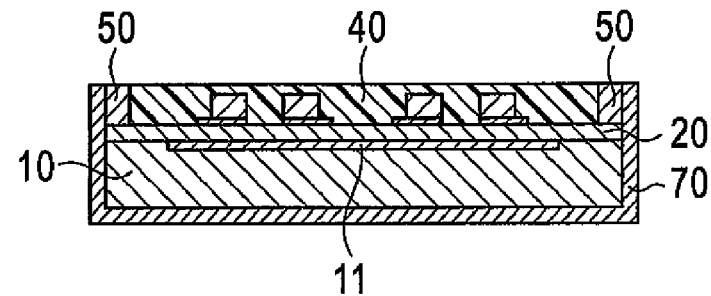

Then the cured resin 50 is formed by curing the liquid resin 51 (step S204, FIG. 4D). If the above-mentioned liquid epoxy resin is used for the liquid resin 51, the liquid resin 51 is heated at about 160° C. for about 1.5 hours for curing.

As described above, the periphery of the semiconductor substrate 10 is enclosed by the periphery enclosure element 70, and the liquid resin 51 is injected into the peripheral surface recess or cavity 3 through the openings 81 of the resin injection mask 80. Because of this, the peripheral surface cavity 3 can be filled with the liquid resin 51 without causing the liquid resin 51 to adhere to the circuit sealing resin 40 and to leak from the edge of the semiconductor substrate 10. Since the liquid resin 51 is cured in this filled state, the step difference in the peripheral area of the semiconductor substrate 10, which is formed by the circuit sealing resin 40 and the insulation film 20, can be eliminated.

FIGS. 1C to 1G and FIG. 2 are referred to again. After carrying out the resin formation processing on the peripheral surface area (step S103, FIG. 1C), the surfaces of the circuit sealing resin 40 and the cured resin 50 are polished (step S104, FIG. 1D). For example, these surfaces are polished until the head portions of the conductive posts 30 are exposed using grinding. The grinding is performed by a high-speed-rotating diamond wheel that contacts the surfaces of the resin. Since the height of the conductive post 30 is approximately 80 µm, the thickness H3 of the circuit sealing resin 40 and the cured resin 50 is also approximately 80 µm. Because the circuit sealing resin 40 and the cured resin 50 are made from the same or similar type of material, such a problem as peeling of the cured resin 50 from a portion where the circuit sealing resin 40 and the cured resin 50 contact each other, due to friction and shock upon grinding during surface polishing, does not occur, and the surfaces of both the resin 40 and 50 are polished flat. When the present invention is applied to a post less type semiconductor substrate in which the conductive post 30 is not formed on the surface, the circuit sealing resin 40 and the cured resin 50 are polished until the thickness H3 becomes a desired thickness.

Figure 1E:
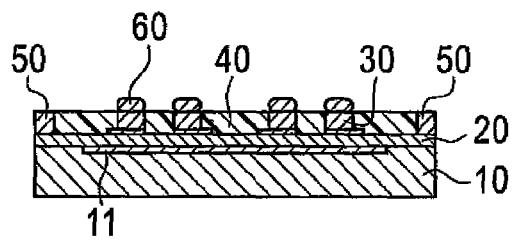

Then an external terminal 60 is formed in the exposed portion of each conductor post 30 (step S105, FIG. 1E). The external terminal 60 is made from a metal conductor such as solder. The external terminal 60 is an LGA (Land Grind Array) bump, for example. Thus, the external terminal 60 and the semiconductor element 11 are electrically connected to each other.

Figure 1F:
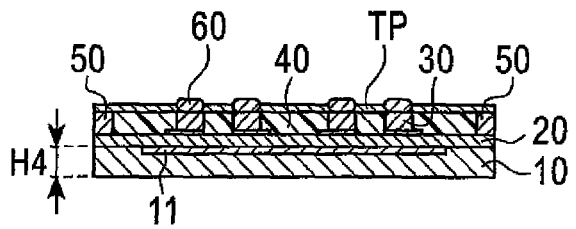

Then the rear face of the semiconductor substrate 10 is polished (step S106, FIG. 1F). Before polishing, a protective tape TP is attached to the entire surface of the circuit sealing resin 40 and the cured resin 50, and the semiconductor substrate 10 is secured by absorbing the upper face of the semiconductor substrate 10 (more specifically, by absorbing the protective tape TP) by an absorbing or securing device (not illustrated). After securing, a grinding element, which may be a diamond wheel, is brought into contact with the rear face of the semiconductor substrate 10, and rotated at high-speed so as to polish the rear face of the semiconductor substrate 10. The semiconductor substrate 10, of which initial thickness H1 is approximately 700 µm, is polished to be thickness H4, that is approximately 50 µm to 115 µm. The protective tape TP is removed after polishing.

The cured resin 50 is provided in the peripheral surface area 3, and no step difference exists in the peripheral portion of the semiconductor substrate 10. Consequently, the peripheral portion of the semiconductor substrate 10 is supported by the cured resin 50 from the front face side when the rear face of the semiconductor substrate 10 is polished. Therefore the semiconductor substrate 10 (particularly the peripheral portion thereof) does not become unstable even if friction and shock are generated during grinding when the rear face is polished, and chips and cracks do not occur to the semiconductor substrate 10. Conventionally, when the thickness of the semiconductor wafer should be reduced by rear face polishing, the reduced thickness limit is an approximately 100 µm. In the above-described embodiment, on the other hand, there is no step difference in the peripheral portion of the semiconductor substrate 10, and accordingly the semiconductor substrate 10 can be polished down to an approximately 50 µm thickness. Since the rear face of the semiconductor substrate 10 is polished after attaching the protective tape TP to the entire front surface of the circuit sealing resin 40 and the cured resin 50, friction and shock upon grinding are decreased by the retaining effect of the protective tape TP.

Figure 1G:
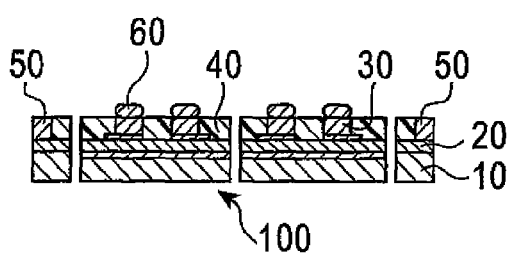

Then the semiconductor substrate 10 is cut into semiconductor chips 100 by dicing (step S107, FIG. 1G). The semiconductor chip 100 is a wafer level chip sized package type semiconductor device. In the dicing process, a circular rotary blade (dicing blade) made of diamond is rotated at high-speed, and the semiconductor substrate 10 is cut while cooling the rotary blade with pure water.

As described in the foregoing, the step difference in the peripheral portion is eliminated by providing the cured resin in the peripheral portion of the semiconductor substrate. The cured resin gives an additional strength to the peripheral portion of the semiconductor substrate from the front face side. Thus, the semiconductor substrate does not become unstable (does not flap or vibrate) when the rear face of the semiconductor substrate is polished, and chips and cracks are not generated in the semiconductor substrate. When the cured resin is provided, the peripheral portion of the semiconductor substrate is enclosed by a dedicated element, and then resin is injected into the peripheral portion via a mask in which a plurality of openings are formed in positions corresponding to the peripheral portion. Thus, the peripheral portion, of the semiconductor substrate can be filled with resin without causing the resin to leak out from the edge of the semiconductor substrate. Because the resin is cured in this filled state, the cured resin can be formed without generating gaps from the resin at the inner side of the semiconductor substrate to the outermost edge of the semiconductor substrate, and a step difference in the peripheral portion can be eliminated. By using the same or similar type of resin for both of these resins, such a problem as peeling of resin during surface polishing does not occur.

Unlike the prior art, the peripheral portion of the semiconductor substrate need not be cut or polished. Consequently, the resin provided around the peripheral portion is not peeled or removed by cutting or polishing of the peripheral portion. Thus, a step difference is not generated in the peripheral portion, and instability is not generated when the rear face of the semiconductor substrate is polished. Chips or cracks of the semiconductor substrate due to vibration and shock generated by cutting or polishing of the peripheral portion can be prevented.

Second Embodiment

Like the first embodiment, the general steps of the manufacturing method for a semiconductor device of the second embodiment are shown in FIGS. 1A to 1G and FIG. 2. The difference from the first embodiment is the step of the peripheral surface area resin formation processing.

Figure 9A:
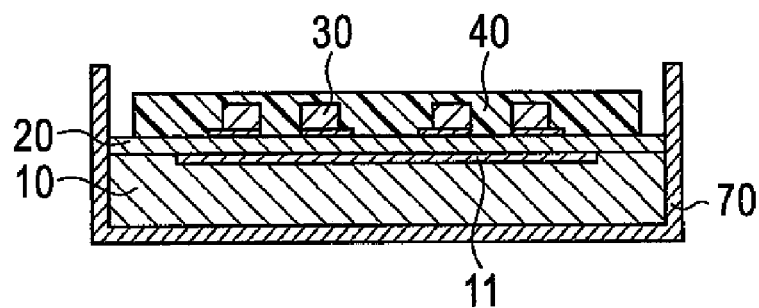
FIG. 9A to FIG. 9C are a series of cross-sectional views depicting respective steps of the peripheral area resin formation processing according to a second embodiment of the present invention.
Figure 9B:
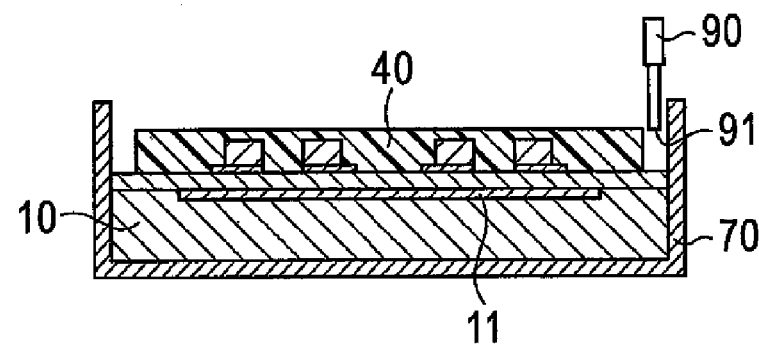
Figure 9C:
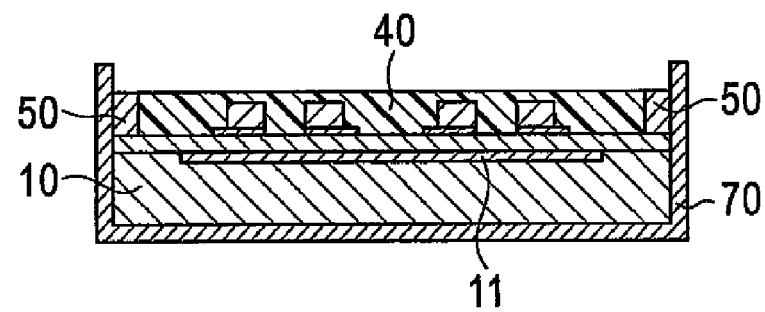
Figure 10:
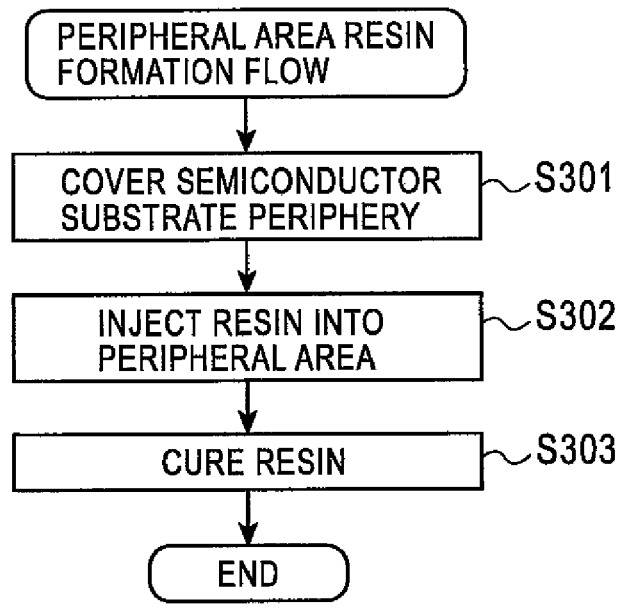
FIG. 10 is a flow chart depicting the peripheral area resin formation flow according to the second embodiment of the present invention.

FIG. 9A to FIG. 9C are a series of cross-sectional views depicting the peripheral surface area resin formation processing according to the second embodiment. FIG. 10 is a flow chart depicting the peripheral surface area resin formation processing flow. The peripheral surface area resin formation processing will now be described with reference to FIGS. 9A to 9C and FIG. 10.

First, like the first embodiment, the periphery of the semiconductor substrate 10, on which the circuit sealing resin 40 is provided in the inner surface area 2, is enclosed by the periphery enclosure element 70 in order to prevent leaking of the liquid resin 51 (step S301, FIG. 9A).

Then the liquid resin 51 is injected into the peripheral surface area 3 using a pen shaped dispenser 90 (step S302, FIG. 9B). The dispenser 90 which contains the liquid resin 51 is positioned over (above) the peripheral surface area 3, as shown in FIG. 9B, and the liquid resin 51 is injected from the tip portion 91 of the dispenser 90.

Figure 11:
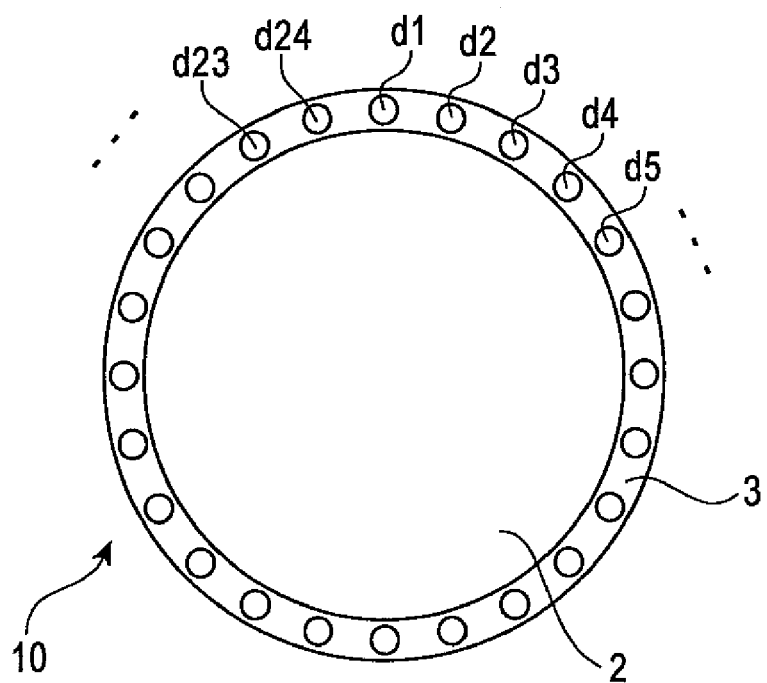
FIG. 11 is a top view of the semiconductor substrate when resin is injected into the peripheral surface area.

FIG. 11 is a top view of the semiconductor substrate 10 when the liquid resin is injected into the peripheral surface area 3. The liquid resin 51 is injected into each of injection points d1 to d24 in the peripheral surface area 3 using the dispenser 90. This injection is performed from the injection point d1 clockwise in the sequence of d2, d3, ..., d23 and d24, for example, using the single dispenser 90. This injection may be performed all at once into the injection points d1 to d24 using a plurality of dispensers 90. The arrangement of the injection points d1 to d24 shown in FIG. 11 is an example, and the number of injection points is not limited to the illustrated number (twenty-four). A mechanism for supporting and moving the dispenser 90 above the semiconductor substrate 10 (not illustrated) is used. This mechanism operates under the control of a suitable computer to perform desired injection of the resin. The computer controls the dispenser 90 according to instructions given by an operator at a factory.

In terms of not causing peeling of resin during the step of polishing the circuit sealing resin 40, which is performed later, it is preferable that the liquid resin 51 is the same (or similar) type of resin as (or to) the circuit sealing resin 40. For example, if the circuit sealing resin 40 is polyimide resin, then polyimide resin having similar viscosity, after-curing-hardness, and type and ratio of included impurities is also used for the liquid resin 51. For the liquid resin 51, a resin suitable for a dispensing system, such as a single liquid type epoxy acid anhydride resin, is used. The liquid resin 51 injected from the dispenser tip 91 spreads and fills not only the injection points but also the entire cavity of the peripheral surface area 3.

The injection amount of the liquid resin 51 is at least sufficient to fill the entire cavity of the peripheral surface area 3. This injection amount can be easily calculated based on such conditions as the diameter of the semiconductor substrate 10 (diameter of a wafer), the diameter of the inner surface area 2 (diameter of the circular area on which circuit sealing resin 40 is formed), and thickness H2 of the circuit sealing resin 40. If there are twenty-four injection points d1 to d24, the Injection amount acquired by calculation is divided by 24 and the resulting amount is injected to each injection point. By injecting the liquid resin 51 from the tip portion 91 of the dispenser 90, the liquid resin 51 is introduced only into the peripheral surface area 3 without causing the liquid resin 51 adhere to the circuit sealing resin 40 formed on the inner surface area 2.

Then the cured resin 50 is provided by curing the liquid resin 51 (step S303, FIG. 9C). If the above-mentioned single liquid type epoxy acid anhydride resin is used for the liquid resin 51, the liquid resin 51 is heated at about 120° C. for about 120 minutes, or at about 150° C. for about 30 minutes for curing.

After the periphery of the semiconductor substrate 10 is enclosed by the substrate periphery enclosure element 70, the liquid resin 51 is injected into the peripheral surface area 3 from the dispenser 90. Because of this, the peripheral surface area 3 is filled with the liquid resin 51 without causing the liquid resin 51 to adhere to the circuit sealing resin 40 and to leak out from the edge of the semiconductor substrate 10. Since the liquid resin 51 is cured, in this filled state, the step difference in the peripheral portion of the semiconductor substrate 10, which is formed by the circuit sealing resin 40 and the insulation film 20, is eliminated, and the peripheral portion of the semiconductor substrate 10 is given an additional strength (or is reinforced) by the cured resin 50 from the front surface side.

Therefore the semiconductor substrate does not become unstable when the rear face is polished, and chips and cracks are not generated in the semiconductor substrate. In the second embodiment, a dedicated mask is not used, unlike the first embodiment.

This application is based on Japanese Patent Application No. 2008-321041 filed on Dec. 17, 2008 and the entire disclosure thereof is incorporated herein by reference.

What is claimed is:

1. A manufacturing method for a semiconductor device, comprising:
   a substrate preparation step of preparing a semiconductor substrate having a front face and a rear face, the front face having an inner surface area and a peripheral surface area, with circuit elements being provided in the inner surface area;
   a circuit sealing step of sealing the circuit elements with circuit sealing resin such that the circuit sealing resin extends over the circuit elements;
   a peripheral area resin formation step of providing cured resin in the peripheral surface area of the semiconductor substrate, said peripheral area resin formation step being carried out after said circuit sealing step;
   a substrate polishing step of polishing the rear face of the semiconductor substrate after the circuit sealing step; and
   a substrate cutting step of cutting the semiconductor substrate after the substrate polishing step so as to obtain at least one semiconductor device.

2. The manufacturing method for a semiconductor device according to claim 1, wherein the peripheral area resin formation step comprises:
   a substrate periphery enclosing step of enclosing a periphery of the semiconductor substrate after the circuit sealing step;

a resin injection step of injecting liquid resin into the peripheral surface area; and a resin curing step of forming the cured resin by curing the injected liquid resin.

3. The manufacturing method for a semiconductor device according to claim 2, wherein the resin injection step includes covering the surface of the circuit sealing resin with a resin injection mask in which a plurality of openings are created in a portion corresponding to the peripheral surface area, and injecting the liquid resin via the plurality of openings.

4. The manufacturing method for a semiconductor device according to claim 2, wherein the resin injection step includes sequentially injecting the liquid resin into a plurality of locations in the peripheral surface area.

5. The manufacturing method for a semiconductor device according to claim 2, wherein the resin injection step includes simultaneously injecting the liquid resin into a plurality of locations in the peripheral surface area.

6. The manufacturing method for a semiconductor device according to claim 1, wherein the substrate polishing step includes polishing the rear face of the semiconductor substrate after attaching a protective tape on the surfaces of the circuit sealing resin and the cured resin.

7. The manufacturing method for a semiconductor device according to claim 1, wherein the substrate polishing step includes polishing the rear face of the semiconductor substrate so that the thickness of the semiconductor substrate becomes 50 µm to 115 µm.

8. The manufacturing method for a semiconductor device according to claim 1, wherein the circuit sealing resin and the cured resin are the same or similar type of resin.

9. The manufacturing method for a semiconductor device according to claim 2, wherein the resin injection step includes injecting the liquid resin into a plurality of locations in the peripheral surface area in a predetermined order.

10. The manufacturing method for a semiconductor device according to claim 1, wherein the thickness of the semiconductor substrate in the preparation step is about 700 µm.

11. The manufacturing method for a semiconductor device according to claim 1, wherein the circuit sealing step provides the circuit sealing resin in the inner surface area only.

12. The manufacturing method for a semiconductor device according to claim 1, wherein the height of the circuit sealing resin is about 200 µm.

13. The manufacturing method for a semiconductor device according to claim 2, wherein the substrate periphery enclosing step is carried out with a periphery enclosing member, and the semiconductor substrate, the circuit sealing resin and the periphery enclosing member define in combination a recess to receive the liquid resin injected in the resin injection step.

14. The manufacturing method for a semiconductor device according to claim 2, wherein the resin injection step is carried out with a squeegee.

15. The manufacturing method for a semiconductor device according to claim 1, wherein the height of the circuit sealing resin is the same as the height of the cured resin.

16. A manufacturing method for a semiconductor device, comprising:

a substrate preparation step of preparing a semiconductor substrate having a front face and a rear face, the front face having an inner surface area and a peripheral surface area, with circuit elements being provided in the inner surface area;

providing conductive interconnects on the semiconductor substrate for connecting predetermined elements in the circuit elements with each other;

a circuit sealing step of sealing the circuit elements and the conductive interconnects with circuit sealing resin;

a peripheral area resin formation step of providing cured resin in the peripheral surface area of the semiconductor substrate, said peripheral area resin formation step being carried out after said circuit sealing step;

a substrate polishing step of polishing the rear face of the semiconductor substrate after the circuit sealing step; and a substrate cutting step of cutting the semiconductor substrate after the substrate polishing step so as to obtain at least one semiconductor device.

17. The manufacturing method for a semiconductor device according to claim 16, wherein the peripheral area resin formation step comprises:

a substrate periphery enclosing step of enclosing a periphery of the semiconductor substrate after the circuit sealing step;

a resin injection step of injecting liquid resin into the peripheral surface area; and a resin curing step of forming the cured resin by curing the injected liquid resin.

18. The manufacturing method for a semiconductor device according to claim 17, wherein the resin injection step includes covering the surface of the circuit sealing resin with a resin injection mask in which a plurality of openings are created in a portion corresponding to the peripheral surface area, and injecting the liquid resin via the plurality of openings.

19. The manufacturing method for a semiconductor device according to claim 17, wherein the resin injection step includes sequentially injecting the liquid resin into a plurality of locations in the peripheral surface area.

20. The manufacturing method for a semiconductor device according to claim 17, wherein the resin injection step includes simultaneously injecting the liquid resin into a plurality of locations in the peripheral surface area.

* * * * *